United States Patent [19]

Isayama et al.

[11] Patent Number: 4,819,178
[45] Date of Patent: Apr. 4, 1989

[54] AUTOMATIC CIRCUIT ADJUSTING SYSTEM AND CIRCUIT ADJUSTING TOOL THEREFOR

[75] Inventors: Shigeo Isayama; Kazutoshi Ogawa, both of Tokyo, Japan

[73] Assignee: Sony Corporation, Tokyo, Japan

[21] Appl. No.: 933,909

[22] Filed: Nov. 24, 1986

[30] Foreign Application Data

Dec. 6, 1985 [JP] Japan .............................. 60-274628

[51] Int. Cl.$^4$ ........................ G05B 23/02; G06F 15/20
[52] U.S. Cl. ............................. 364/481; 324/73 AT; 364/489; 364/579
[58] Field of Search ................ 364/468, 481, 488–491, 364/579, 580, 167.01; 324/73 PC, 73, AT, 158 R, 158 F

[56] References Cited

U.S. PATENT DOCUMENTS

| | | | |
|---|---|---|---|
| 4,212,075 | 7/1980 | Cleversey et al. | 364/489 X |
| 4,277,831 | 7/1981 | Saunders et al. | 364/481 |
| 4,300,196 | 11/1981 | Lopresti | 364/481 X |
| 4,384,334 | 5/1983 | Tateishi et al. | 364/481 |
| 4,469,553 | 9/1984 | Whitehead | 324/73 PC X |
| 4,686,627 | 8/1987 | Donovan et al. | 364/481 |

Primary Examiner—Joseph Ruggiero
Attorney, Agent, or Firm—Ronald P. Kananen

[57] ABSTRACT

An automatic circuit adjusting system comprises a circuit adjusting tool assembly. The circuit adjusting tool assembly is movable to adjust different orientations of circuit elements. The circuit adjusting tool assembly has a plurality of adjusting tools. The circuit adjusting tool assembly is controlled in its movement and selection of adjusting tools by means of a microprocessor based controller. The controller is so programmed as to shift the circuit adjusting tool assembly to different orientations of circuit elements on a printed circuit board in order according to a preset order. The controller is also preset to schedule selection of the desired one of the adjusting tools corresponding to the position of the circuit adjusting tool assembly. According to the preferred construction, the circuit adjusting tool assembly comprises a single common driving motor for driving a plurality of the adjusting tools. Driving torque of the driving motor is distributed to the respective adjusting tools through a common power train that drives all of them at the same speed and magnitude. The adjusting tools in the circuit adjusting tool assembly are thrustingly movable in an axial direction to engage with their respective one of the cirucit elements to be adjusted. The adjusting tools are normally placed in an idling position and shifted to an active position to engage with the corresponding cirucit elements when selected by the controller.

29 Claims, 10 Drawing Sheets

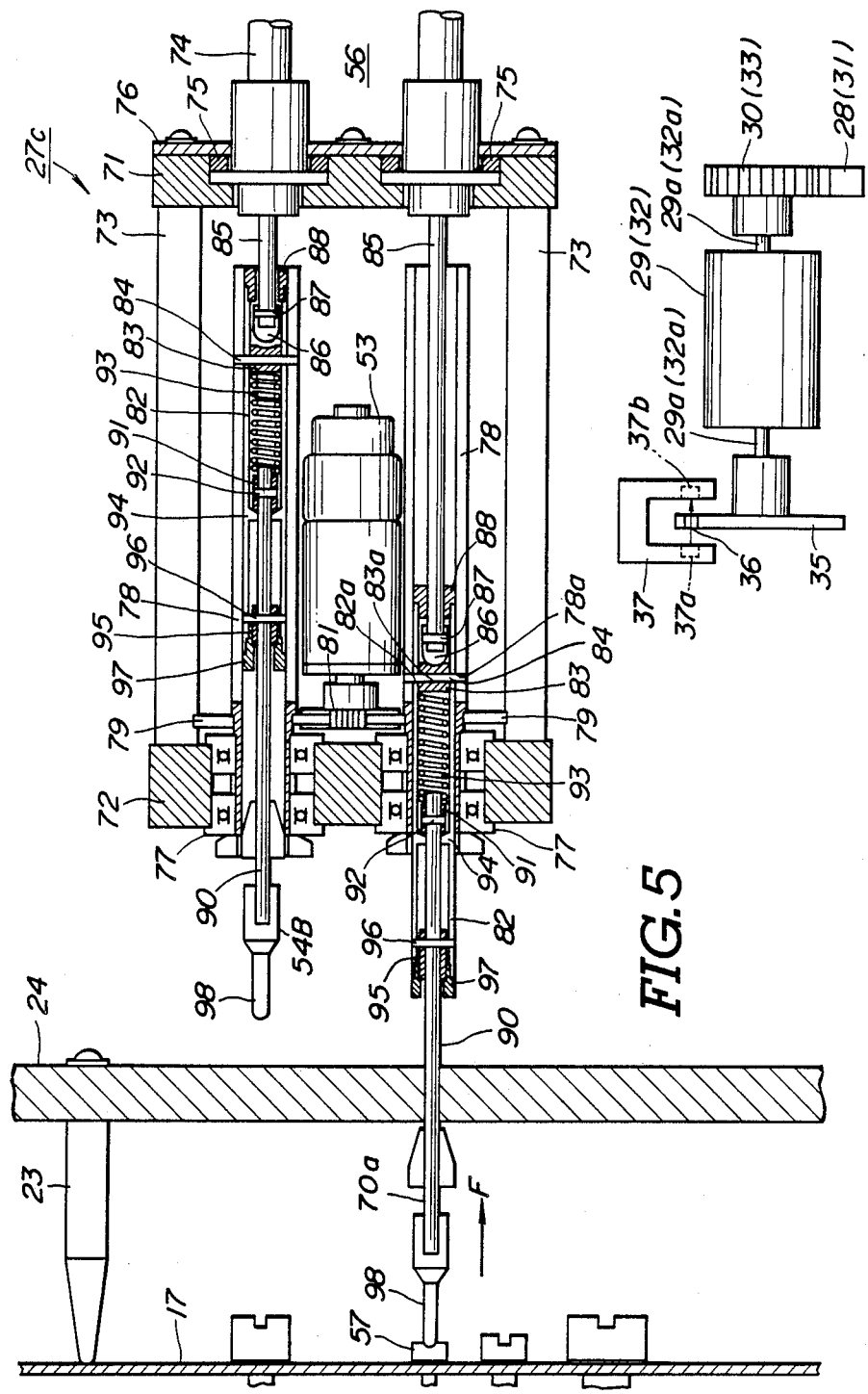

AUTOMATIC CIRCUIT ADJUSTING SYSTEM AND CIRCUIT ADJUSTING TOOL THEREFOR

BACKGROUND OF THE INVENTION

1. Field of the Invention

The present invention relates generally to an automatic circuit adjusting system which performs testing and adjustment of the circuit. The invention also relates to a circuit adjusting tool for performing automatic adjustment of the circuit. More specifically, the invention relates to an automatic circuit adjusting system and tool thereof which rotatingly adjust circuit elements, such as volume potentiometers and so forth in a printed circuit board.

2. Description of the Background Art

U.S. Pat. No. 4,384,334, issued on May 17, 1983, to Kazushi Tateishi et al, discloses an Apparatus for Driving Pulse Motors for Automatically Adjusting External Circuits. The apparatus has a plurality of circuit adjusting tool, such as screw-drivers, for rotatingly adjusting circuit elements, such as volume potentiometers and so forth, on printed circuit boards. Each of the circuit adjusting tools is fixedly located at a position corresponding to the orientation of an associated circuit element of the printed circuit board to be adjusted. In order to rotatingly adjust the associated circuit element, each circuit adjusting tool is operated by a pulse motor which is independently operative of the other circuit adjusting tools. Operations of the pulse motors are controlled by means of a microprocessor. The microprocessor applies a test signal to the printed circuit board and compares the output data with predetermined standard data to derive control signals for respective pulse motors to drive associated circuit adjusting tools so as to adjust the circuit to output the output data matching the predetermined standard data in response to the test data.

Such automatic circuit adjusting apparatus as set forth above is effective in adjusting circuit elements in printed circuit boards. However, on the other hand, such conventional apparatus is suitable for performing adjustment only for a specific structure of printed circuit board. Namely, the apparatus can adjust only printed circuit boards having an arrangement of the circuit elements corresponding to the arrangement of the adjusting tools. When the arrangement of the circuit elements of the printed circuit boards is modified, corresponding rearrangment is required for the circuit adjusting tools. Furthermore, as set forth above, since the conventional apparatus employs a plurality of pulse motors so that each operates an associated circuit adjusting tool, the appartus becomes bulky and expensive.

SUMMARY OF THE INVENTION

Therefore, it is an object of the present invention to provide an automatic circuit adjusting system which does not require substantial rearrangement of a circuit adjusting tool to perform circuit adjustment for different printed circuit boards having different arrangements of circuit elements.

Another object of the invention is to provide an automatic circuit adjusting system which is compact and inexpensive.

A further object of the invention is to provide a circuit adjusting tool assembly which can adjust different circuit elements with a single unit.

In order to accomplish the aforementioned and other objects, an automatic circuit adjusting system, according to the invention, comprises a circuit adjusting tool assembly. The circuit adjusting tool assembly is movable to adjust different orientations of circuit elements. The circuit adjusting tool assembly has a plurality of adjusting tools. The circuit adjusting tool assembly is controlled in its movement and selection of adjusting tools by means of a microprocessor based controller. The controller is so programmed as to shift the circuit adjusting tool assembly to different orientations of circuit elements on a printed circuit board in order according to a preset order. The controller is also preset to schedule selection of the desired one of the adjusting tools corresponding to the position of the circuit adjusting tool assembly.

According to the preferred construction, the circuit adjusting tool assembly comprises a single common driving motor for driving a plurality of the adjusting tools. Driving torque of the drive motor is distributed to the respective adjusting tools through a common power train that drives all of them at the same speed and magnitude. The adjusting tools in the circuit adjusting tool assembly are thrustingly movable in an axial direction to engage with their respective one of the circuit elements to be adjusted. The adjusting tools are normally placed in an idling position and shifted to an active position to engage with the corresponding circuit elements when selected by the controller.

According to one aspect of the invention, an automatic circuit adjusting system comprises an adjusting tool assemlby with adjusting tools for performing adjustment on a circuit element on a printed circuit board, a driving means associated with the adjusting tool assembly for driving the adjusting tools, a movable frame carrying the adjusting tool assembly for shifting the latter within a predetermined two-dimensional coordinate system, first means for supporting the printed circuit board in a predetermined orientation with respect to the two-dimensional coordinate system, second means for applying a preset test signal for a printed circuit board, second means for receiving an output in response to the test signal from the printed circuit board, the second means comparing the output of the printed circuit board with a predetermined reference signal for deriving an error signal, third means for shifting the movable frame according to a predetermined schedule for positioning the adjusting tool assembly in alignment with each of the circuit elements to be adjusted in order, and fourth means for deriving an adjusting magnitude for the circuit element to be adjusted based on the error signal and producing a driver signal for driving the driving means at a magnitude corresponding to the value of the error signal.

According to the preferred construction, the adjusting tool assembly has a plurality of mutually different adjusting tools for performing adjustments on different circuit elements. The driving means comprises a single driving motor designed for driving the plurality of adjusting tools. The driving motor is drivingly associated with each of the adjusting tools through a power train. The power train is so designed as to constantly distribute driving torque of the driving motor to its respective adjusting tools.

The automatic circuit adjusting system further comprises fifth means selecting one of the adjusting tools according to the type of the circuit element to be adjusted and coupling a selected one of the adjusting tools to the circuit element.

Alternatively, the adjusting tool comprises a screw driver for rotatingly adjusting the circuit element to be adjusted, in which the circuit element includes a screw head to be rotated for adjustment, and the fourth means adjusts the driving torque of the driving means for driving the screw driver with a first torque which is smaller than that required for rotatly driving the screw head of the circuit element for establishing engagement between a driver head of the screw driver and the screw head. The fourth means drives the screw driver with the first torque for a given period of time which is determined in view of the possible maximum period required for establishing engagement between the driver head and the screw head.

The automatic circuit adjusting system further comprises a sixth means for storing angular position data of the screw head for driving the screw driver at the corresponding angular position for re-establishing engagement between the driver head and the screw head after once performing adjustment of the circuit element.

The adjusting tool comprises a screw driver for rotatingly adjusting the circuit element to be adjusted, in which the circuit element includes a screw head to be rotated for adjustment, and the fourth means drives the driving means under the control of the second means which continuously applies a test signal and monitors output of the printed circuit board in order to stop driving of the driving motor when output of the printed circuit board changes.

In the preferred embodiment, the automatic circuit adjusting system third means includes a table memory storing position data of the circuit element to be adjusted, with respect to the two-dimensional coordinate system for identifying the orientation of the circuit element to be adjusted. The third means comprises a first frame movable in a first direction parallel to one axis of the two-dimensional coordinate system, and a second frame movable in a second direction parallel to a second axis of the two-dimensional coorindate system and perpendicular to the first direction. The adjusting tool assembly is mounted on the second frame for movement therewith in the second direction, and the second frame is mounted on the first frame for movement therewith in the first direction.

The third means includes a table memory storing position data of the circuit element to be adjusted and a data identifying one of the adjusting tools to be used for performing adjustment of the circuit element to be adjusted, the position data being preset with respect to the two-dimensional coordinate system for identifying the orientation of the circuit element to be adjusted. The third means derives shifting magnitude of the adjusting tool assembly for aligning the selected one of adjusting tools to the circuit element to be adjusted.

According to another aspect of the invention, an automatic circuit adjusting system for testing and adjusting a plurality of circuit elements on a printed circuit board comprises a single tool assembly movable on a two-dimensional coordinate system and having a plurality of tools, each of which is designed for performing adjustment of a corresponding one or more circuit elements, a driving means for selectively operating one of the tools in the tool assembly for performing adjustment of one of the circuit elements coupled with the one of tools, first means for supporting the printed circuit board in a predetermined orientation in the two-dimensional coordinate system, second means for producing a test signal for performing testing of the printed circuit board, the test signal being so determined as to obtain a predetermined output from the printed circuit board when the circuit element is accurately adjusted, third means for receiving the output of the printed circuit board produced in response to the test signal and comparing the output with a predetermined reference signal representative of the predetermined output to be received when the circuit element is accurately adjusted, the third means producing an error signal based on a deviation between the output of the printed circuit board and the reference signal, and fourth means for driving the tool assembly to shift the selected one of tools in alignment with the circuit element to be adjusted and driving the one of the tools for adjustment so as to reduce the error signal value to zero.

The fourth means includes a table memory storing position data of a plurality of circuit elements and orders for performing adjustments. The table memory further stores data identifying one of the tools to be utilized for adjustment with respect to each of the circuit elements to be adjusted. The automatic circuit adjusting system allows for re-adjustment of the circuit element which is once adjusted. The first means includes a conductive means releasably connecting the second means and third means to the printed circuit board. The conductive means comprises a plurality of contact pins, each of which is oriented to contact with terminals formed on the printed circuit board for establishing signal transmission between the second and third means and the printed circuit board. The tools comprise screw drivers having mutually different driver heads.

The screw drivers are drivingly associated with a common driving motor incorporated in the fourth means to be driven by the common driving motor. The fourth means includes means for coupling a selected one of the screw drivers to a screw head of the circuit element to be adjusted. The common driving motor drives the plurality of screw drivers constantly at the same rotation speed in relation to each other.

BRIEF DESCRIPTION OF THE DRAWINGS

The present invention will be understood more fully from the detailed description of the invention given herebelow and from the accompanying drawings of the preferred embodiment of the invention, which, however, should not be taken to limit the invention to the specific embodiment but are for explanation and understanding only.

In the drawings:

FIG. 4 is an enlarged section of the position sensor for detecting angular position of a pulse motor employed in the preferred embodiment of the automatic circuit adjusting system of FIGS. 1 to 3;

FIG. 5 is an enlarged section of a screw driver assembly as a circuit adjusting tool assembly, employed in the preferred embodiment of the automatic circuit adjusting system of FIG. 1;

DESCRIPTION OF THE PREFERRED EMBODIMENT

Figure 1:
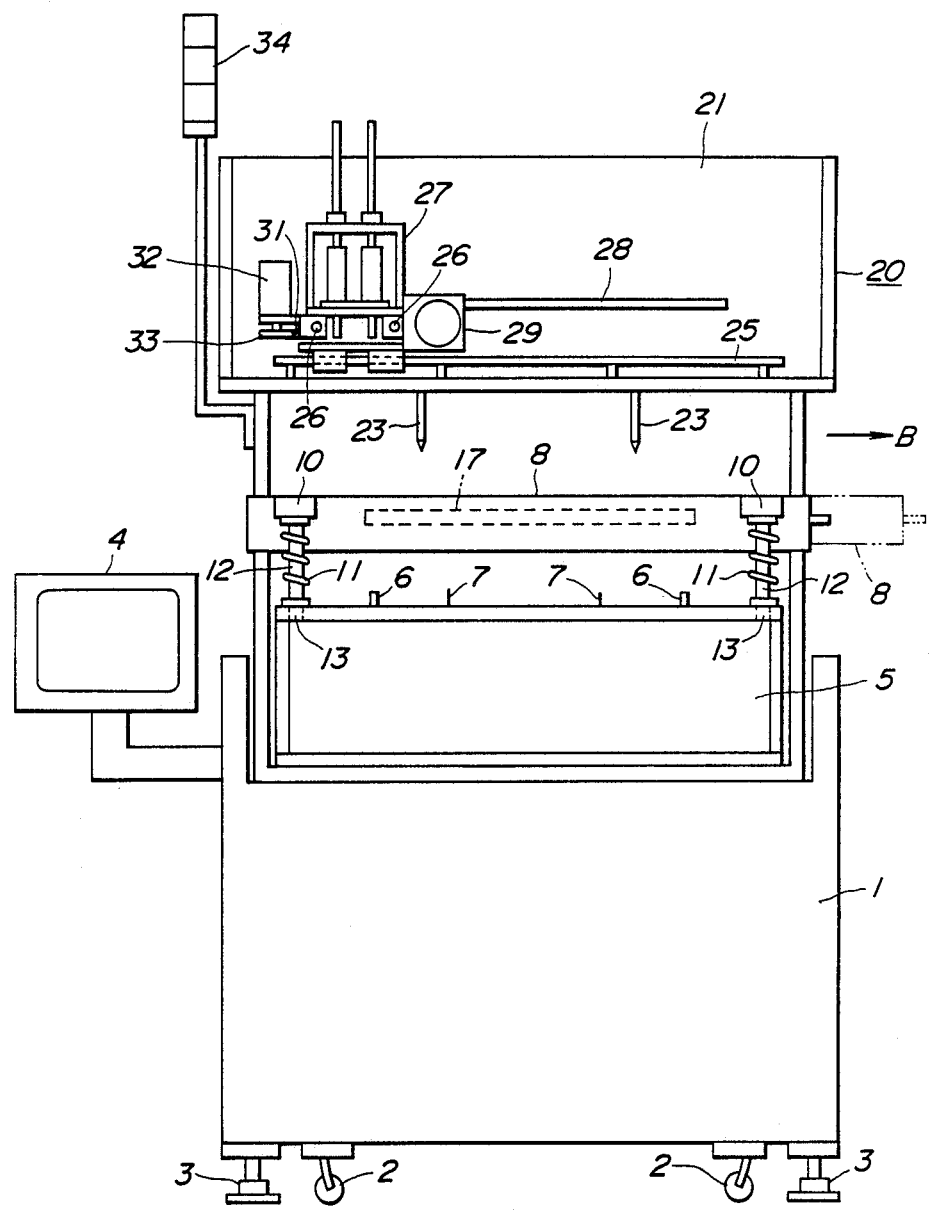
FIG. 1 is a front elevation of the preferred embodiment of an automatic circuit adjusting system according to the invention.
Figure 2:
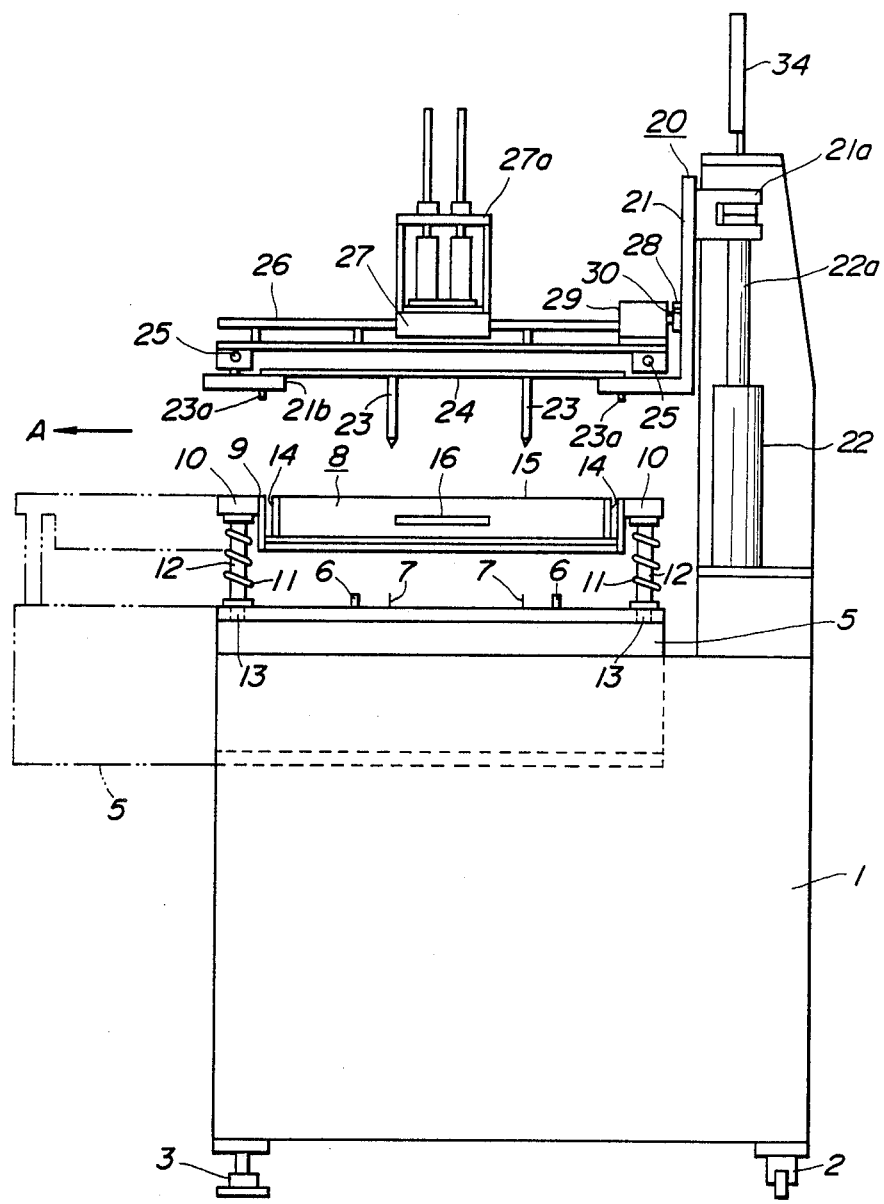
FIG. 2 is a side view of the preferred embodiment of the automatic circuit adjusting system of FIG. 1.
Figure 3:
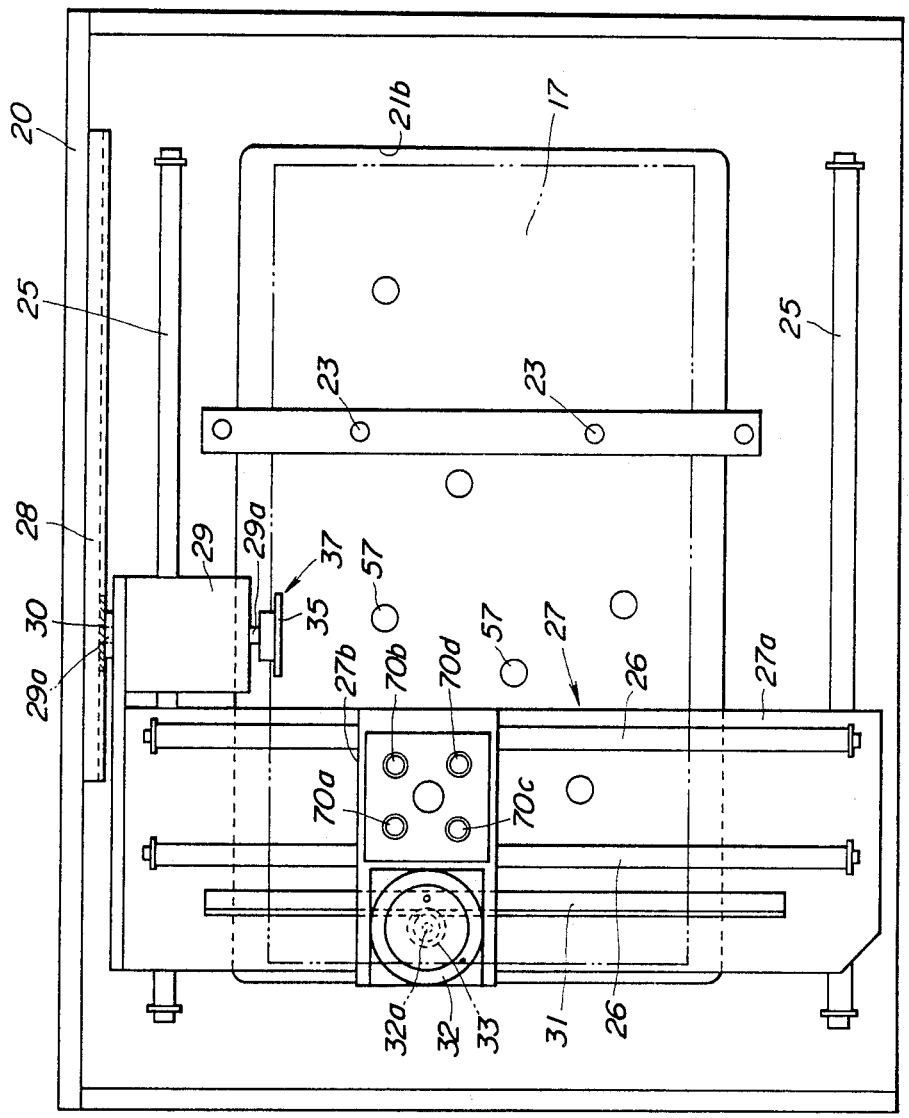
FIG. 3 is a partial plan view of the preferred embodiment of the automatic circuit adjusting system of FIG. 1.

Referring now to the drawings, particulary to FIGS. 1 to 3, the preferred embodiment of an automatic circuit adjusting system includes a generally hollow box-shaped base 1 housing a control circuit which will be discussed later. The control circuit may comprise a microcomputer, signal generator circuits, detectors and so forth. The base 1 has a plurality of casters 2 to be movable. The base 1 also has a plurality of stopper legs 3. The casters 2 and the stopper legs 3 are respectively located adjacent respective corners of the base 1. The stopper legs are vertically movable between an up position and a down position. When the stopper legs 3 are in the up position, the lower end of the legs are away from a floor to allow the base 1 to move by the aid of the casters 2. On the other hand, when the stopper legs 3 are in the down position, the base 1 is lifted upwardly to place the casters 2 away from the floor. Therefore, in the down position, the stopper legs 3 prevent the base 1 from moving. A CRT display 4 is provided at the side of the base 1. The CRT display 4 is connected to a microcomputer for displaying various data and information thereon.

The base 1 is formed with a front end and upper end opened recess. A fixture 5 is removably received within the recess of the base 1. When the fixture 5 is set in the base 1, it enters horizontally from the front end opening of the recess along the arrow A of FIG. 1. On the other hand, the fixture 5 is horizontally pulled out from the recess of the base 1 along the arrow A. The fixture 5 has positioning pins 6 and contact pins 7. The positioning pins 6 and the contact pins 7 protrude upwardly from the upper surface of the fixture 5.

Opposing to the fixture 5, a printed circuit board support 8 is provided. The printed circuit board support 8 has a pallet frame 9. Projections 10 extend laterally from the pallet frame 9. Guide shafts 12 extend downwardly from the projections 10. The axes of the guide shafts 12 are positioned in alignment with through openings 13 formed through the fixture 5. Coil springs 11 are wound around the guide shafts 12. The upper ends of the coil springs 11 seat on the lower surface of the projections 10. On the other hand, the lower ends of the coil springs 11 seat on the upper surface of the fixture 5. Therefore, the printed circuit board support 8 is resiliently supported above and in parallel to the fixture 5.

The printed circuit board support 8 further include a pallet 15. The pallet 15 is thrustingly set in the pallel frame 9. The pallet 15 is designed to fixingly mount thereon the printed circuit board 17. The pallel 15 is movable in a direction transverse to the direction indicated by arrow A and can be removed by lateral thrusting movement relative to the fixture 5. A handle 16 is provided for the pallet so that the pallet can be easily pulled out and set in the fixture 5. The direction of the motion of the pallet 15 is indicated by an arrow B in FIG. 1. Therefore, the pallet 15 is movable between a set position where it is set in the fixture for performing testing and adjustment of the circuit of the printed circuit board and a released position where it is laterally protruded from the fixture as shown by phantom line in FIG. 1 and allows replacement of the printed circuit board 17 thereon.

A driver unit support 20 is provided above the fixture 5. The driver support 20 is supported by means of vertically extending guide frames 18 which extend upwardly from the base 1. The driver support 20 is vertically movable along the guide frames 18. The driver support 20 includes a movable frame 21. The movable frame 21 is of generally L-shaped configuration having a horizontally extending section and a vertically extending section. A projection 21a extends backwardly from the vertically extending section of the movable frame 21. The projection 21a is connected to the top of an actuation rod 22a of an air cylinder 22 which drives the movable frame 21 up and down along the guide frame 18.

The horizontal section of the movable frame 21 is of a generally rectangular configuration and is formed with a rectangular opening 21b in the mid-section thereof. Through the opening 21b, pushing rods 23 extend downwardly from a pusher base 24 of a generally flat plate. The pusher base 24 is fixedly fitted on the upper surface of the horizontal section of the movable frame 21. The pusher base 24 is formed of a synthetic resin plate, such asn an acrylate resin plate. The pusher base 24 is formed with a plurality of through openings for receiving screw drivers which will be discussed later therethrough to access adjustable circuit elements to be adjusted. Therefore, the through openings are arranged at the positions corresponding to and in alignment with the adjustable circuit elements to be adjusted.

In an alternative, the pusher base 24 may comprise one or more narrow plates arranged so as not to interfere with the screw-drivers access of the adjustable circuit elements.

The pushing rods 23 are arranged to detect whether the printed circuit board 17 is accurately set in the fixture 5. When the movable frame 21 is driven downwardly by means of the air cylinder 22, the lower ends of the pushing rods 23 contact printed circuit board 17 so that the printed circuit board can be fixed on the pallet 15. On the other hand, the pushing rods 23 may also serve as stoppers for stopping downward movement of the movable frame.

A plurality of pushing rods 23a are also extending downwardly from the lower surface of the horizontal section of the movable fraem 21. The pushing rods 23a oppose the upper edge of the pallet support frame 9 to depress the latter downwardly according to downward movement of the movable frame 21.

A pair of guide bars 25 extend laterally on the movable frame 21. The direction along which the guide bars 25 extend will be hereafter referred to as "x-axis direction". The guide bars 25 are arranged apart from each other and located adjacent the front and rear ends of the movable frame respectively. A carriage 27a of a screw-driver assembly 27 is movably mounted on the guide bars 25 for movement along the x-axis direction. A pair of guide bars 26 are fixedly mounted on the upper surface of the carriage 27a. The guide bars 26 extend in a direction perpendicular to the x-axis direction. The direction along which the guide bars 26 extend will be hereafter referred to as a "y-axis direction". A screw-driver unit frame 27b is movably mounted on the guide bars 26 for movement along the y-axis direction.

An x and y coordinate system is formed in the system with respect to the printed circuit board 17 to be tested and adjusted. As set forth the x-axis of the coordinate system extends laterally with respect to the movable frame and the y-axis of the coordinate system extends in the front-to-rear direction.

Along the guide bars 25, a rack plate 28 with a plurality of rack teeth is provided. The rack plate 28 is fixed onto the vertical wall of the movable frame 21. A pinion gear 30 engages with the rack teeth of the rack teeth 28. The pinion gear 30 is fixedly mounted on an output shaft 29a of a pulse motor 29 which is mounted on the carriage 27a. Therefore, the pinion gear 30 is rotatingly driven by means of the pulse motor 29 to drive the carriage 27a along the guide bars 25. Since the screw-driver unit frame 27b is fixedly mounted on the carriage 27a as set forth above, the screw-driver unit frame is shifted in an x-axis direction with the carriage by means of the pulse motor 29. Another pulse motor 32 is mounted on the screw-driver unit frame 27b. The pulse motor 32 is designed to rotatingly drive a pinion gear 33 through its output shaft 32a. The pinion gear 33 engages with a rack plate 31 having a plurality of rack teeth. The rack plate 31 is fixedly mounted on the carriage 27a and extends along the guide bars 26. Therefore, by driving the pulse motor 31, the screw-driver unit frame 27b is driven in an y-axis direction with respect to the carriage 27a.

In the shown embodiment, the output shafts 29a and 32a of the pulse motors 29 and 32 extend from both sides of the motor bodies. The pinion gears 30 and 33 are fixed on one end of the output shafts as set forth above. On the other hand, rotary disks 35 are fixed to the other ends of the output shafts 29a and 32a of the pulse motors 29 and 32. Each of the rotary disks 35 is formed with an aperture 36. The aperture 36 is positioned away from the center of the rotary disk 35 and adjacent the peripheral edge of the rotary disk. The peripheral edge portion of the rotary disk 35 is inserted within a recess formed in a photosensor 37. As shown in FIG. 4, the photosensor 37 comprises a light emitting element 37a and a light sensing element 37b. The light emitting element 37a emits a light beam toward the light sensing element 37b. The aperture 36 on the rotary disk 35 is so arranged as to be aligned to the light emitting element 37a at the initial angular position of the associated pulse motor 29 or 32. The light sensing element 37b thus receives the light beam emitted from the light emitting element 37a only when the pulse motor is in an initial angular position.

When the carriage 27a of the screw-driver assembly 27 is placed at an initial position, the pulse motor 29 is in the initial angular position. Similarly, when the screw-driver unit frame 27b is in an initial position, the pulse motor 32 is in the initial angular position. The pulse motors 29 and 32 are respectively designed to be driven at a given angle by a signal driving pulse applied thereto. Therefore, by applying a known number of driving pulses, a known angle of angular displacement can be caused in the pulse motor 29 and 32. Therefore, by controlling a number of driving pulses to be applied to the pulse motors 29 and 32, the angular positions of the pulse motors can be controlled and hereby the positions of the carriage 27a and the screw-driver unit frame 27b can be controlled. The number of driving pulses to be applied to the pulse motors 29 and 32 is controlled by a microprocessor 41 which forms a main pair of a control circuit. Details of the control circuit will be discussed later.

As shown in FIG. 5, a screw-driver unit 27c is mounted on the screw-driver unit frame 27b for movement therewith. The screw-driver unit 27c comprises upper and lower frame members 71 and 72. Each of the upper and lower frame members 71 and 72 is formed into a square or a rectangular configuration in plan view. Cylindrical bar members 73 are inserted between the upper and lower frame members 71 and 72 for supporting the latter members in a spaced apart relationship parallel to each other. As shown in FIG. 3, the bar members 73 are fixed adjacent the corners of the upper and lower frame members 71 and 72. The frame members 71 and 72 support four screw-driver devices 70a, 70b, 70c and 70d. Each of the screw-driver devices 70a, 70b, 70c and 70d has a different type at bit from the others. Bits of respective screw-driver devices 70a, 70b, 70c and 70d are selected depending upon the types of the screw heads of the circuit elements to be adjusted.

Each screw-driver device 70a, 70b, 70c and 70d comprises coaxially arranged inner and outer cylindrical sleeves 78 and 82. A driver shaft 90 extends through the inner sleeve 82. A driver head 98 is fitted to the lower end of the drive shaft 90 for rotation therewith. The driver shaft 90 has a radially extended flange section 92. This flange section 92 mates with an annular projection 94 extending from the inner periphery of the inner sleeve 82, to limit the downward axial movement with respect to the inner sleeve. A coil spring 93 is disposed within the internal space of the inner sleeve 82 above the driver shaft 90. The lower end of the coil spring 93 is seated onto another annular projection 94a extending from the inner periphery of the inner sleeve and located above the annular projection 94. On the other hand, the upper end of the coil spring 93 is seated onto a fitted block 83 inserted within the internal space of the inner sleeve 82. The fitting block 83 is formed to laterally extend through an opening 83a. The fitting block 83 is so arranged within the internal space of the inner sleeve as to align the through opening 83a with openings 82a and 78a formed through the peripheries of the inner and outer sleeves 82 and 78. A keying pin 84 extends through the aligned openings 78a, 82a and 83a. The openings 78a and 82a of the inner and outer sleeves 82 and 78 are in forms of axially extending grooves. These grooves form openings 82a and 78a and allow axial movement of the inner sleeve 82 with respect to the outer sleeve 78 and of the driver shaft 90 with respect to the inner sleeve.

An air cylinder 74 is fitted onto the upper frame member 71. The air cylinder 74 has a radially extending flange 74a which is inserted within a mounting recess 71a formed in the upper frame member 71. The flange 74a is fixed to the upper frame member 71 by means of a fitting ring 75 and a fitting plate 74. The air cylinder 74 has an actuation rod 85 with a round-headed top 86. The round-headed top 86 is fixed to the lower end of the actuation rod 85 of the air cylinder 74 by means of a keying pin 86. A fitting block 88 is fitted to the top of the inner sleeve 82 and allows the actuation rod 85 to pass therethrough. The the round-headed top 86 is inserted within the internal space of the outer sleeve 78 for thrusting movement therealong. The top 86 mates with the fitting block 83. The actuation rod 85 is driven by means of the air cylinder 74 to drive the inner sleeve 82 and the driver shaft 90 downwardly and upwardly. A fitting block 85 and a driver support member 97 are fitted at the lower end of the inner sleeve 82. A keying pin 96 extends through the periphery of the inner sleeve 82 and the fitting block 95.

With this arrangement, the inner and outer sleeves 82 and 78 and the driver shaft 90 are rotatable together. The cylindrical sleeve 78 is rotatably supported on the lower frame member 72 through bearings 77. A drive motor 53 is provided in the screw-driver unit 27c for driving the screw driver devices 70a, 70b, 70c and 70d. The drive motor 53 has an output shaft 53a on which a drive gear 81 is fixedly mounted. The drive gear 81 drivingly engages with four driven gears 79 which are fixed to the outer periphery of respectively corresponding outer sleeves 78 so as to rotate with the associated outer sleeve. Therefore, the screw driver devices 70a, 70b, 70c and 70d are driven by the driving torque of the drive motor 53 transmitted through the drive gear 81 and the driven gears 79.

The drive motor 53 and the air cylinders 74 are also controlled by the control circuit. In practice, the control circuit selects one of the screw driver devices 70a, 70b, 70c amd 70d according to the type of the screw head of the circuit element to be adjusted. The control circuit activates a selected one of the air cylinders 70a, 70b, 70c and 70d for shifting the driver head 98 downwardly together with the inner sleeve 82 and the driver shaft 90. On the other hand, the control circuit controls driving of the drive motor 53.

Figure 6:
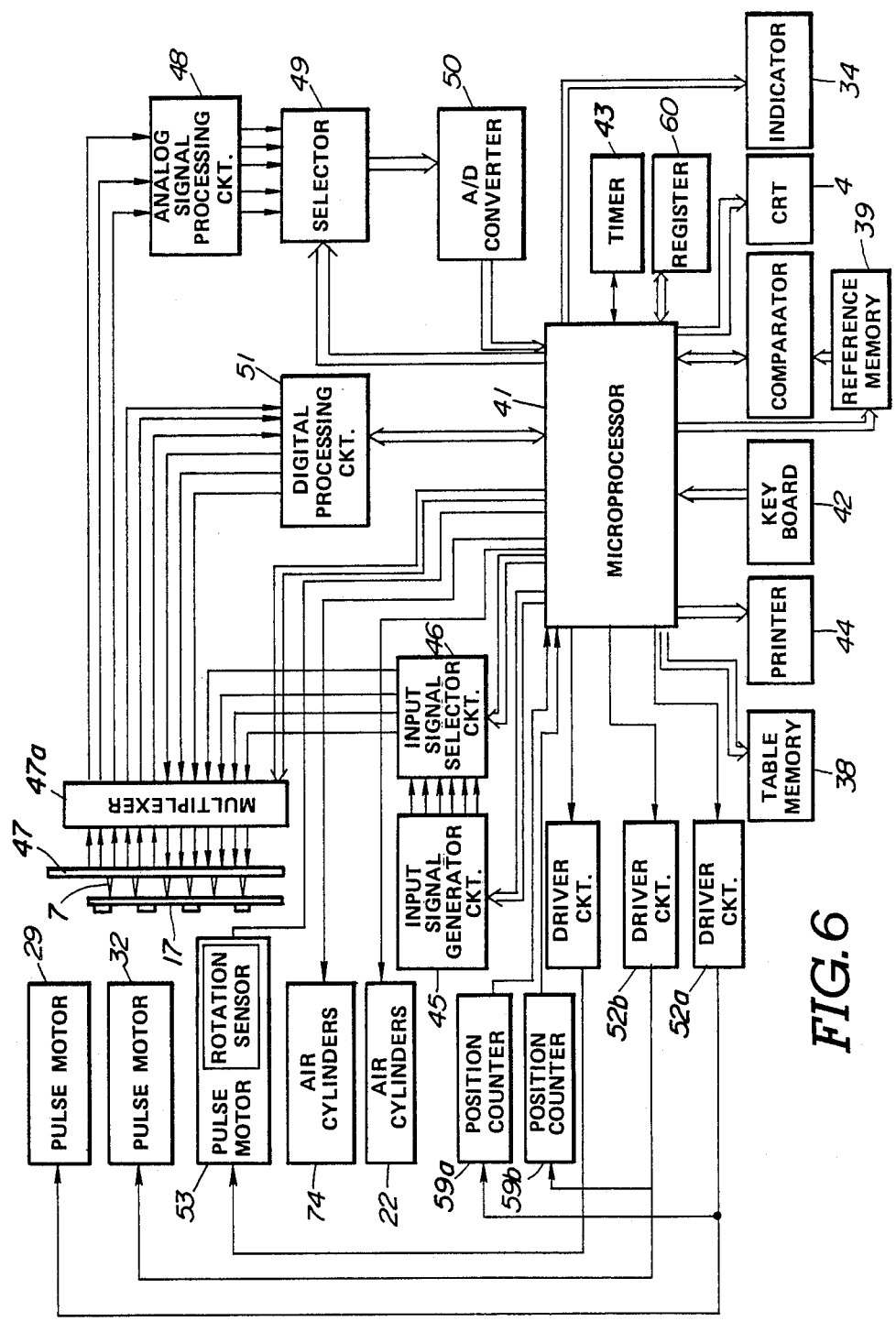
FIG. 6 is a block diagram of a control circuit for the preferred embodiment of the automatic circuit adjusting system of FIG. 1.

As shown in FIG. 6, the control circuit generally comprises the microprocessor 41. The micorprocessor 41 is connected to a keyboard 42, a CRT display 43, a printer 44. Control commands are input to the microprocessor 41 through the keyboard 42. Various information, such as test data, output data, and so forth, is displayed on the CRT display 43 and are printed by means of the printer 44.

The microprocessor 41 is also connected to an input signal selector circuit 46. The input signal selector circuit 46 is, in turn connected to an input signal generator circuit 45 which produces various input signals necessary for testing the printed circuit boards. When testing and adjusting printed circuit boards for video tape recording and/or reproducing apparatus, the input signals will be a white signal, a color-bar signal, a drop-out detecting signal and so forth. On the other hand, when testing and adjusting printed circuit boards for audio tape recording and/or reproducing apparatus, the input signal wil be sine-wave signal and so forth. The input signal generator circuit 45 may comprise a plurality of signal generators designed for generating the aforementioned input signals. The input signal selector circuit 46 selects one or more input signals from the input signal generator circuit 45 to apply to the printed circuit board 17 to be tested and adjusted through the contact plate 47 and the contact pins 7. A buffer/multiplexer circuit 47a is provided for selectively applying test signals according to a preset schedule. The buffer/multiplexer circuit 47a is, in turn, connected to the microprocessor 41 to be controlled by a multplexing control signal therefrom. On the other hand, the microprocessor 41 is connected to a digital signal processing circuit 51. The digital signal processing circuit 51 is controlled by the microprocessor 41 according to the input command input through the keyboard 42 and generates digital test data. The digital test data is also fed to the contact plate 47 through the buffer/multiplexer circuit 47a to the printed circuit board 17 to be tested and adjusted through the contact pins 7.

Analog outputs which are output in response to application of the input signals through the input signal selector circuit 46 from the printed circuit board 17 are received by an analog signal processing circuit 48 through the contact pins 7 and the contact plate 47. On the other hand, the digital output's output in response to application of the digital test data from the printed circuit board 17 is received by the digital signal processing circuit 51.

The analog signal processing circuit 48 is connected to a signal selector circuit 49. The signal selector circuit 49 is controlled by the microprocessor 41 to select one of the output signals from the printed circuit board 17 and feed it to an analog-to-digital (A/D) converter 50. The A/D converter 50 converts the analog signal input from the signal selector circuit 49 and inputs it to the microprocessor 41. On the other hand, the digital signal processing circuit 51 feeds the received output data to the microprocessor. The microprocessor 41 applies the received input data from the digital processing circuit 51 or the A/D converter 50 to a comparator 40. The comparator 40 is, in turn, connected to a reference memory 39. The reference memory 39 stores various references data respectively corresponding to input signals and digital test data to be applied to the printed circuit board for testing. The microprocessor 41 accesses one of the memory blocks in the reference memory 39 to read out the reference data corresponding to the testing input applied to the printed circuit board. The comparator 40 compares the data from the microprocessor with the read reference data. A comparator signal indicative of the difference between the compared data is produced by the comparator 40. The comparator signal is fed to the microprocessor 41.

The microprocessor 41 produces a screw driver selecting signal and screw driver unit shaft control signals as control signals. A table memory 38 is provided to store position data of respective circuit elements of the printed circuit board to be adjusted. The table memory 38 also stores data of the screw head type. The microprocessor 41 reads out position data and screw head data from the table memory on the basis of the comparator signal from the comparator 40 to derive the driver selection signal depending upon the type of the screw head of the circuit element to be adjusted. The microprocessor 41 also derives the screw driver shift control signal based on the position data of the circuit element to be adjusted. The driver selection signal is fed to one of actuators (not shown) of the air cylinders 74 for actuating the air cylinder corresponding to selected driver head 98. On the other hand, the screw driver unit shift control signals are applied to driver circuits 52a and 52b respectively adapted to generate driver pulses to drive the pulse motors 29 and 32 for shifting the carriage 27a and screw driver unit frame 27b of the screw driver assembly 27. By driving of the pulse motor 29, the carriage 27a is shifted in an x-axis direction. Also, by driving of the pulse motor 32, the screw drive unit frame 27b is shifted in a y-axis direction. During the x-axis direction and y-direction motions of the carriage and the screw driver unit frame, the position of the screw driver devices are monitored by counting driver pulses output from the driver circuits 52a and 52b. For inputting count data to the microprocessor 41, an x-axis position counter 59a and a y-axis position counter 59b are provided. The x-axis position counter 59a is connected to the driver circuit 52a for counting occurrences of the driver pulses therefrom. The y-axis position counter 59b is connected to the driver circuit 52b for counting occurrences of the driver pulse therefrom.

Figure 7:
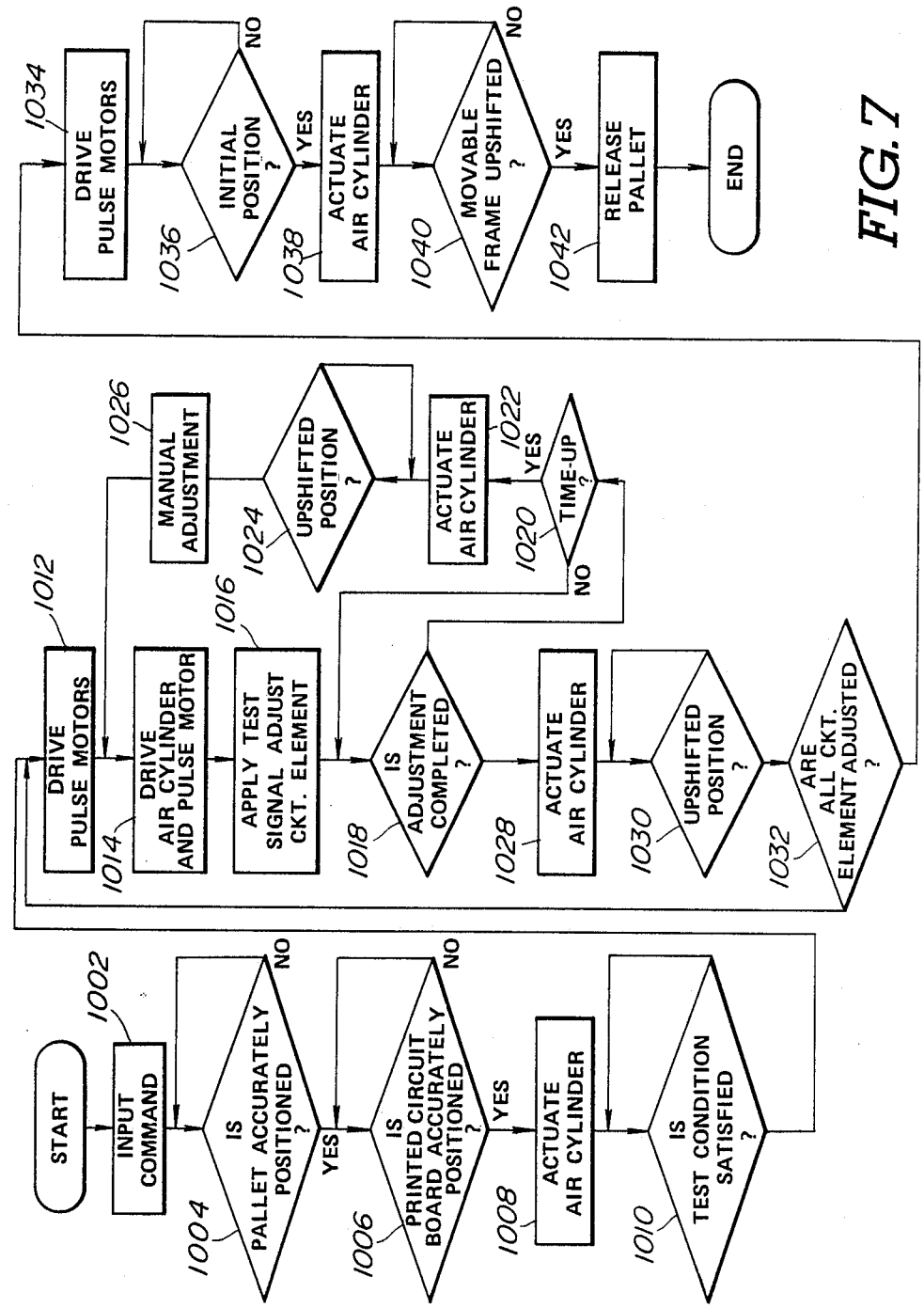
FIG. 7 is a flowchart showing a control program for the preferred embodiment of the automatic circuit adjusting system.

Operation of the aforementioned preferred embodiment of the automatic circuit adjusting system according to the invention will be described herebelow with reference to a flowchart of a printed circuit board testing and adjusting program of FIG. 7. The program of FIG. 7 is triggered in response to insertion of the pallet 15 into the pallet support 9. After entry into execution of the testing and adjusting program, the microprocessor 41 is placed in a stand-by state for peforming testing and adjusting operation in response to a command to be entered by means of the keyboard 42. Therefore, at step 1002, the command is checked cyclically or sequentially until the keyboard 42 is operated to issue the command. In response to the command through the keyboard, the pallet position is checked at step 1004 to determine whether the pallet 15 is set in the predetermined position or not. Furthermore, at the step 1006, a check is performed to determine whether the printed circuit board 8 is set on the pallet in the correct manner or not. In practice, checking of the pallet position and the printed circuit board direction is performed by means of optical sensors (not shown) fixed to the fixture 5 and pusher base 24.

When the pallet 15 is not set at the predetermined position or the printed circuit board 8 is not set in a correct direction as checked at the steps 1004 and 1006, execution of the program loops for respectively given period of time. When either the pallet 15 or the printed circuit board cannot be set within the given period of time, the microprocessor 41 generates an alarm signal. The alarm signal may be fed to the indicator 34 and the CRT display. Therefore, the indicator 34 is switched ON to indicate an abnormal condition. At the same time, the CRT display 4 displays faulty data.

On the other hand, when it is confirmed that the pallel 15 is set at the predetermined position or the printed circuit board 8 is set in a correct direction as checked at the steps 1004 and 1006, the air cylinder 22 is activated to move the driver unit support 20 downwardly, at a step 1008. By downward movement of the driver unit support 20, the pushing rods 23 come into contact with the printed circuit board 8 on the pallel 15. At the same time, the pins 38 provided on the movable frame 21 come into contact with the peripheral wall of the pallet 8. Then the air cylinder 22 is again activated to lift the driver unit support 20 upwardly until the driver unit support reaches an upwardly shifted predetermined position. Upward and downwrd movement of the driver unit support 20 is repeated several times. In practical embodiment, the aforementioned operation for shifting the driver unit support upwardly and downwardly is perfomred three times. During this upward and downward movement of the driver unit support 20, the contact pins 7 repeatedly contact and release from respectively associated contact points. This effectively removes the flux layer formed on a substrate of the printed circuit board to assure test signal transmission through the contact pins 7.

Figure 8:
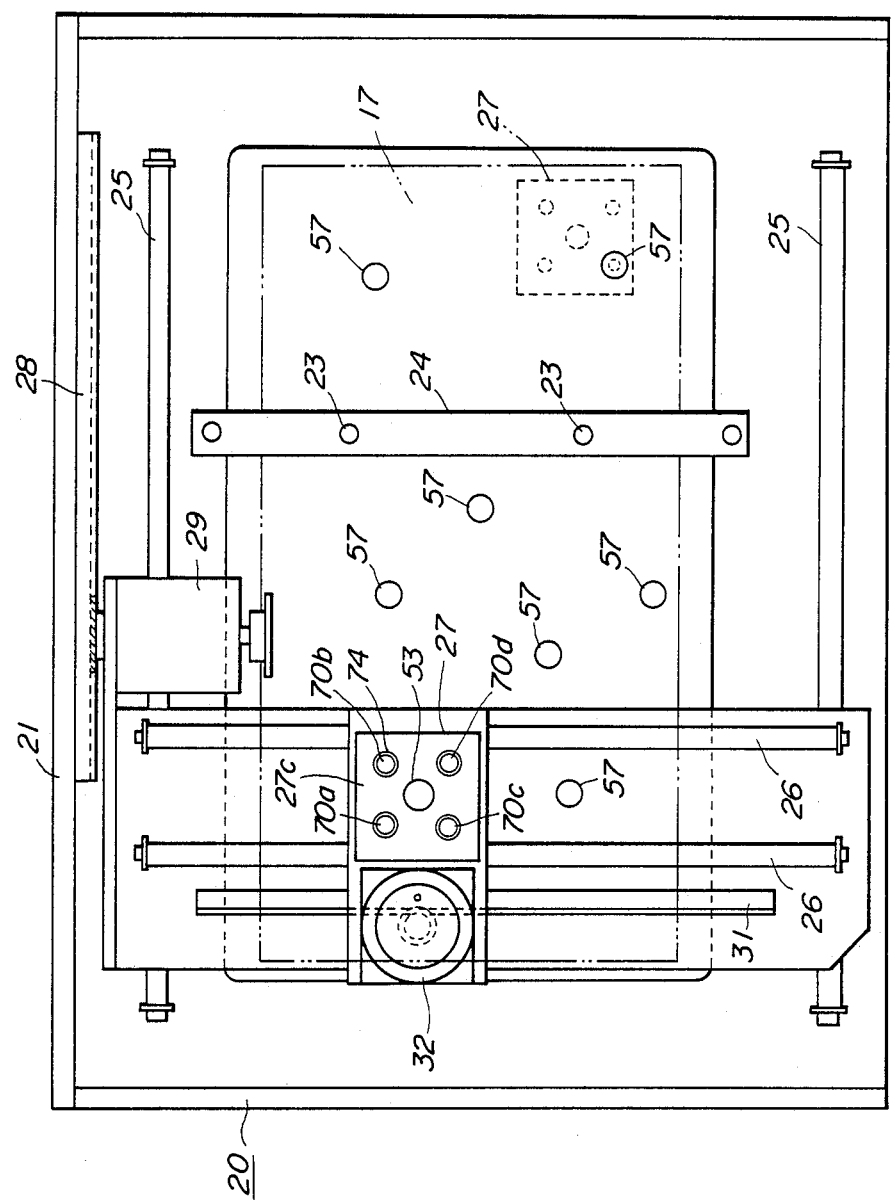
FIG. 8 is a partial plan view of the preferred embodiment of the automatic circuit adjusting system similar to FIG. 3, but showing the shifted position of the screw driver assembly by broken line.

The upward and downward operation of the driver unit support 20 ends after a given number of cycles of operation, e.g. 3 cycles and at the driver unit support position shifted down to contact the pusher rods 23 onto the printed circuit board 17, as shown by broken line in FIG. 8. At the same time, the contact pins 7 contact with the printed circuit board for supplying the test signal and/or test data therethrough. This condition is confirmed at a step 1010. After the condition of FIG. 8 is confirmed at the step 1010, the system starts testing and adjusting operation of the printed circuit board 17 set in the predetermined position. At a step 1012, the microprocessor 41 accesses the table memory 38 for locating a pre-programmed first circuit element to be adjusted. The microprocessor 41 reads out x- and y-coordinate data of the first circuit adjusting element and also the screw head type indicative data from the table memory 38. Based on the read data, the microprocessor 41 selects one of the driver devices 70a, 70b, 70c and 70d to be used for preforming adjustment of the first circuit element, based on the screw head type indicative data. The microprocessor 41 also derives the magnitude of shifting in an x-axis direction of the carriage and magnitude of shifting in a y-axis direction of the screw driver unit frame 27b based on the x- an y-coordinates of the first adjusting circuit element and the selected driver device position. The microprocessor 41 then produces a screw driver unit shift control signal to be supplied to the driver circuits 52a and 52b. The screw driver unit shift control signal to be supplied to the driver circuit 52a is indicative of the shifting magnitude of the carriage 27a of the screw driver assembly 27. On the other hand, the screw driver unit shift control signal to be supplied to the driver circuit 52b is indicative of the shifting magnitude of the screw driver unit frame 27b in a y-axis direction. In response to the screw driver unit shift control signals. the driver circuits 52a and 52b become active to feed driver pulses to the pulse motors 29 and 32.

The pulse motor 29 is driven by the driver pulse from the driver circuit 52a for driving the pinion gear 30. As set forth, the pinion gear 30 is engaged with the rack 28 extending in an x-axis direction. Therefore, the carriage 27a is shifting in an x-axis direction for a controlled magnitude according to the number of driver pulses produced by the driver circuit 52a. During this x-axis shifting of the carriage, the driver pulses to be supplied to the pulse motor 29 is also input to the x-axis position counter 59a. The x-axis position counter 59a feeds back the x-axis position signal indicative of the x-axis position of the carriage, to the microprocessor.

Figure 9:
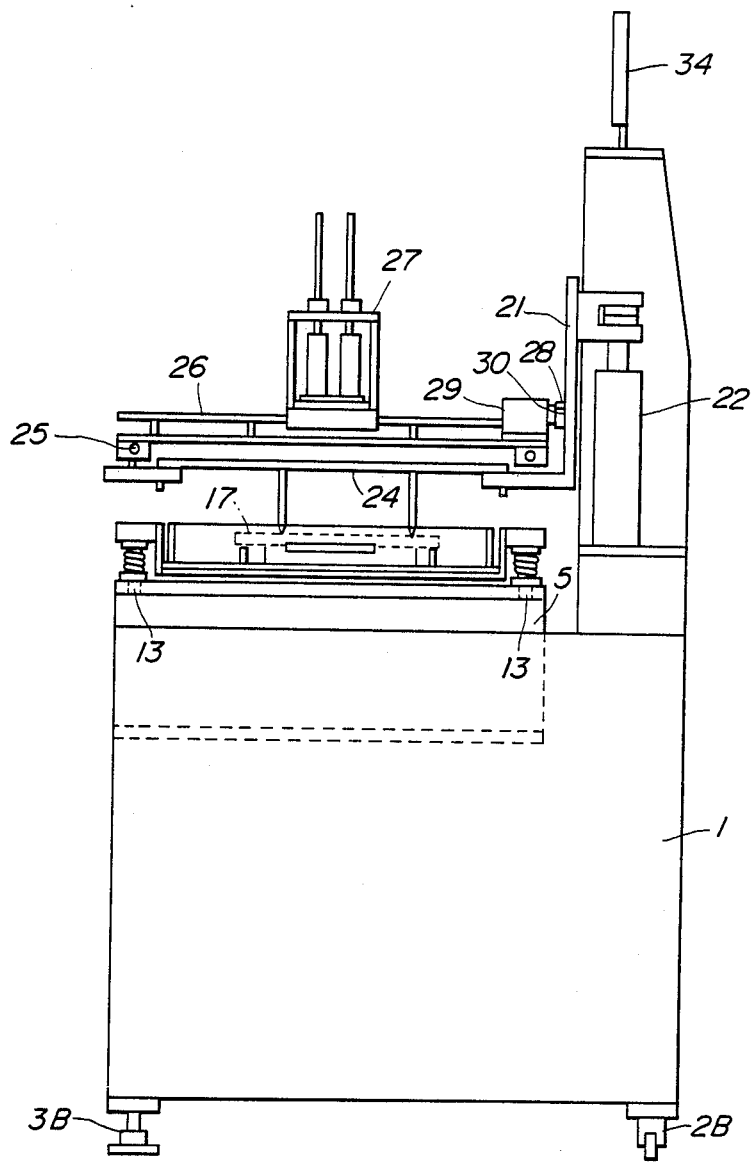
FIG. 9 is a front elevation of the preferred embodiment of the automatic circuit adjusting system similar to FIG. 1, but showing the position where the screwdriver unit is axially shifted to an operating position.
Figure 10:
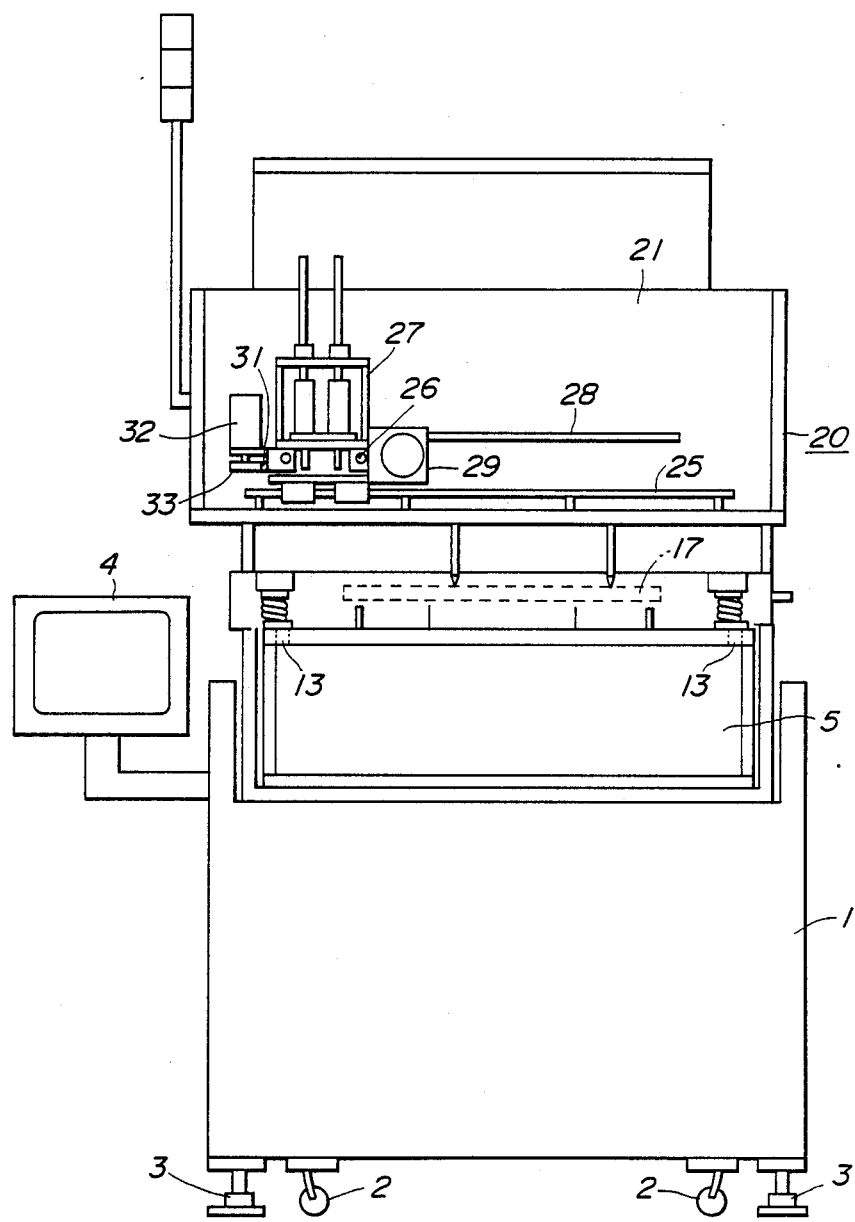
FIG. 10 is a side elevatoin of the automatic circuit adjusting system similar to FIG. 2, but showing the position shifted to the operating position.

On the other hand, the pulse motor 32 is driven by the driver pulse from the driver circuit 52b for driving the pinion gear 33. As set forth, the pinion gear 33 is engaged with the rack gear 31 extending in a y-axis direction. Therefore, the screw driver unit frame 27b is shifting in a y-axis direction for a controlled magnitude according to the number of driver pulses produced by the driver circuit 52b. During this y-axis shifting of the screw driver unit frame 27b, the driver pulses to be supplied to the pulse motor 32 are also input to the y-axis position counter 59b. Therefore, the screw driver assembly 27 is placed to align the driver head 98 of the selected one of the driver devices 70a, 70b, 70c and 70d with the screw head of the first adjusting circuit element, as shown in FIGS. 9 and 10. The x-axis position counter 59b feeds back the y-axis position signal indicative of the y-axis position of the carriage to the microprocessor 41.

The microprocessor 41 receives the x- and y-axis positions of the carriage 27a and the screw driver unit frame 27b and thereby detects instantaneously positioning in the x- and y-coordinates of the selected driver device 70a, 70b, 70c or 70d. Therefore, the microprocessor 41 detects that the selected one of the driver device 70a, 70b, 70c and 70d is in alignment with the first adjusting circuit element. Then, the microprocessor 41 operates the driver circuits 52a and 52b for stopping the driver pulses.

Then, at a step 1014, the microprocessor 41 outputs the driver selection signal and screw driver driver signal. The driver selection signal is supplied to one of the actuators associated with the selected one of the driver device. On the other hand, the screw driver drive signal is supplied to a driver circuit 53a. The screw driver drive signal is representative of required driving torque of the pulse motor 53 for adjusting driving torque to be applied to the driver devices 70a, 70b, 70c and 70d. In practice, the driving torque of the pulse motor 53 may be adjusted between a predetermined small torque which is insufficient for driving the screw head of the adjusting screw of the circuit element to be adjusted, and a greater torque sufficient for driving the screw head for causing angular displacement in the adjusting screw of the circuit element. The driver circuit 53a thus supplied first drive signal to drive the pulse motor in smaller torque and a second drive signal to drive the pulse motor in greater torque.

In order to establish engagement between the the driver head 98 of the selected one of driver device devices and the first adjusting circuit element, the microprocessor 41, at first supplies, the screw driver drive signal ordering the smaller torque. Therefore, the driver circuit outputs the first drive signal for driving the pulse motor 53 with smaller torque. In response to the first drive signal from the driver circuit 53a, the pulse motor 53 is driven with the smaller torque to drive all of the driver devices 70a, 70b, 70c and 70d by transmitting the smaller driving torque through the drive gear 81 and the driven gears 79 which are fixed to the outer sleeves 78 of the driver devices. Since the outer sleeve 78 is keyed with the inner sleeve 82 for rotation together but allowing axial movement of the inner sleeve with respect thereto, and the inner sleeve is keyed with the driver shaft for rotation together and allowing the latter to axially shift with respect thereto, the inner sleeve and the driver shaft 90 are driven to rotate with the smaller driving torque.

In synchronism with driving of the pulse motor, the driver selection signal is applied to the actuator of the air cylinder 74 of the selected one of the driver devices 70a, 70b, 70c and 70d. Therefore, the air cylinder 74 associated with the selected driver device becomes active to increase the air pressure in the cylinder to depress the inner sleeve 82 with the driver shaft 90. The inner sleeve 82 shifts downwardly with the driver shaft 90 until the lower end edge thereof comes into contact with the upper edge of the fitting block 95. When the lower edge contacts to the upper edge of the fitting block 95, the inner sleeve 82 is prevented from shifting further downwardly. Thus the driver shaft 90 solely shifts further downwardly to reach the driver head 98 to the screw head of the first adjusting circuit element. Since the driver device is driven with the smaller torque, which is insufficient to drive the adjusting screw of the first adjusting circuit element, rotation of the driver shaft 90 is braked to stop when the driver head engages with the screw head of the adjusting screw. By stopping rotation of the selected one of the driver devices, the power train constituted by the driver gear 81 and the driven gears 79 is braked not to rotate. Therefore, a reacting torque to be exerted to the pulse motor 53 increases, thus stopping driving of the motor. This is detected by a rotation sensor 53b incorporated in the pulse motor 53. The rotation sensor 53b then feeds a sensor signal indicative of stopping of the motor. In response to the sensor signal, the microprocessor 41 ceases the driver selection signal and the screw driver drive control signal to stop torque of the pulse motor and to stop downward driving of the air cylinder 74.

At a step 1016, the microprocessor 41 performs a testing operation for testing the printed circuit board 17 according to the pre-set schedule. Namely, the microprocessor 41 sends commands to the input signal generator 45 and the digital processing circuit 51 to activate them. The input signal generator 45 thus activated to produce various analog form test signals and feeds the test signals to the input signal selector circuit 46. Also, a digital processing circuit 51 produces and feeds the test data. The test signal selected by the input signal selector circuit 46 and the test data from the digital processing circuit 51 is selectively applied to the contact pins 7 for performing testing of the printed circuit board.

Output from the printed circuit board 17 in response to application of the test signal and/or test data is received through the contact pins 7. The outputs through the contact pins 7 are selected by the buffer/multiplexer circuit 47a and selectively fed to the digital processing circuit 51 and the analog signal processing circuit 48. The digital processing circuit 51 produces a test result indicative data to be input to the microprocessor 41. On the other hand, the analog signal processing circuit 48 feeds a test result indicative analog signal produced based on the input from through the buffer/multiplexer circuit 47a. The test result indicative analog signal is selected by signal selector circuit 49 and then A/D converted by A/D converter 50 into a test result indicative digital data. The microprocessor 41 applies the received test result indicative data to the comparator 40. At the same time, the microprocessor 41 accesses the associated memory block of the reference memory 39 for reading out reference data to be compared with the test result indicative data. The comparator 40 outputs a signal indicative of the result of the comparing operation, as set forth above. The microprocessor 41 derives driving magnitude of the pulse motor 53 for determining angular displacement of the adjusting screw of the first adjusting circuit element. Based on the derived displacement angle, the microprocessor 41 produces the screw driver drive signal ordering greater torque of the pulse motor 53 and indicative of the given cycles of the motor revolution required for causing angular displacement in the adjusting screw of the first adjusting circuit element. In response to the screw driver drive control signal, the driver circuit 53b feeds the driving signal to the pulse motor to cause required cycles of motor revolution with the greater torque for rotating the screw head of the adjusting screw of the first adjusting circuit element. During this adjustment operation, the rotation sensor 53b detects angular shift of the screw head of the adjusting screw of the first adjusting circuit element to feed the sensor signal to the microprocessor 41. The microprocessor 41 temporarily writes in the angular position data with a data identifying the adjusting circuit element in a register 60. Testing and adjusting with respect to the first adjusting circuit element is cyclically and repeatedly performed until the test result indicative data in a predetermined relationship with the associated reference data is obtained. Therefore, at a step 1018, the comparator output is checked whether the specific relationship between the test result indicative data and the reference data is obtained or not. After checking of completion of adjustment at the step 1018, a value of a timer 43 is checked whether it is greater than a given value, at a step 1020. The timer 43 is designed to measure an elapsed time from starting of testing and adjusting operation after the selected one of the driver devices 70a, 70b, 70c and 70d is placed in alignment and the driver head 98 of the selected driver device enters into engagement with the screw head of the adjusting screw of the first adjusting circuit element. When the timer value is smaller than the given value, the process returns to the step 1018 to perform testing and adjusting operation again. On the other hand, when the timer value becomes greater than or equal to the given value, then the process goes to a routine allowing manual adjustment. In this case, the micrprocessor 41 produces a fail signal to be fed to the indicator 34 for indicating need for manual adjustment. At the same time, the microprocessor 41 feeds the fail data indicative signal to the CRT display 4 for displaying the faulty circuit element which requires manual adjustment. Furthermore, the microprocessor 41 outputs a driver device position control signal for shifting the driver device upwardly to release the driver head 98 from the screw head of the adjusting screw of the first adjusting circuit element, at a step 1022. A check is performed to determine if the driver device has reached the predetermined upwardly shifted position at a step 1024. This check is performed by providing a detector which is suitable for detecting the driver device position. After confirming the upwardly shifting position of the driver device, manual adjustment is performed at a step 1026. In order to resume automatic testing and adjustment, the command is again entered through the keyboard.

In response to re-entry of the command, the microprocessor 41 restarts the automatic testing and adjusting operation from the step 1014. Then, the microprocessor 41 again produces the driver position control signal to activate the air cylinder 74 of the corresponding driver device 70a, 70b, 70c or 70d. Therefore, the driver device shifts the driver head 98 downwardly to again establish engagement with the screw head of the first adjusting circuit element. Then, the testing process is repeated at the steps 1016 and 1018.

After confirming that that test result indicative data is in a predetermined relationship with the reference data, the microprocessor 41 then produces the driver position control signal for shifting the driver device upwardly to release the driver head 98 from the screw head of the adjusting screw of the first adjusting circuit element, at a step 1028. The driver position at the predetermined upwardly shifted position is confirmed at a step 1030. After the step 1030, a check is made to determine whether all of the circuit elements have been adjusted or not, at a step 1032. This check at the step 1032 is performed by checking if the circuit element just adjusted in the aforementioned cycle of the testing and adjusting operation is the last circuit element to be adjusted according to the preset adjustment schedule.

Figure 11:
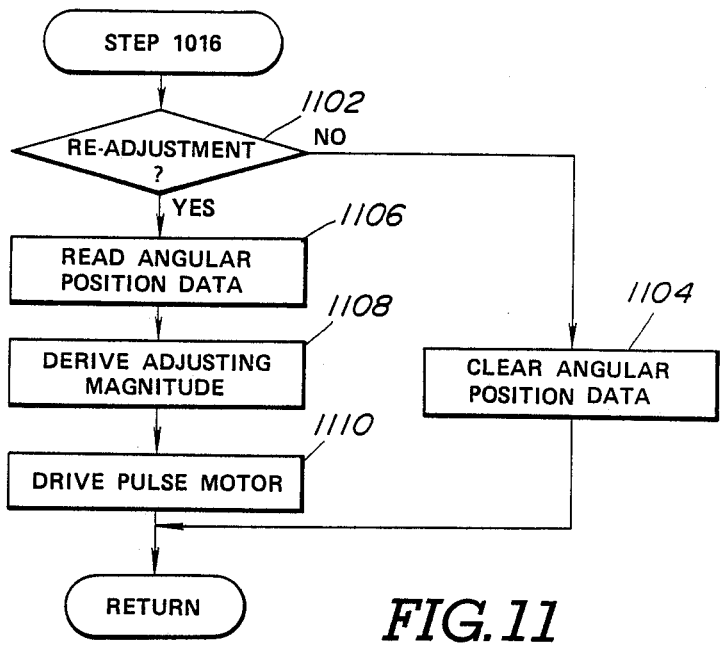
FIG. 11 is a flow chart of a sub-routine of the control program to be executed at a step 1016 in the control program of FIG. 7.

During the aforementioned cycles of testing and adjusting operations, it will become necessary to perform re-adjustment for the already adjusted circuit elements. In such case, the microprocessor 41 determines the already adjusted circuit element to be re-adjusted based on the test result indicative data and derives the driver unit shaft control signals to return the screw driver unit 27 to the circuit element to be re-adjusted. Then, the testing and adjusting operation in the steps 1012 to 1018 is again performed. In order to allow re-adjustment, adjustment routine of the step 1014 may be performed in the procedure as shown in FIG. 11. In the adjustment routine of FIG. 11, at first it is checked whether the adjustment of the angular position of the screw head of the adjusting screw of the associated circuit element is for initial adjustment or re-adjustment, at a step 1102. When the adjustment to be performed is the initial adjustment, then the content of a memory block in the register 60 corresponding to the circuit element to be adjusted, is cleared for storing angular position data in the subsequent adjusting operation, at a step 1104. On the other hand, when the adjustment to be taken place is re-adjustment for the already adjusted circuit element, the corresponding memory block in the register 60 is accessed by the microprocessor 41 for reading out the angular position the adjusting screw of the circuit element to be adjusted, at a step 1106. The microprocessor 41 drives an angular position of the adjusting screw of the circuit element based on the test result data. Based on the angular position data as read at the step 1106, and the derived angular position toward which the adjusting screw is adjusted, the microprocessor 41 derives a required angular shift for the associated circuit element and thus produces the screw driver drive signal and the driver selection signal, at a step 1108. According to the screw driver drive signal and the driver selection signal, the aforementioned adjusting operation is performed at a step 1110.

At this time, since testing and adjustment for only the first adjusting circuit element is effectively complete, testing and adjustment have to be performed with respect to the subsequently scheduled circuit elements. In order to perform testing and adjustment for the subsequently scheduled circuit element, the process returns to the step 1012. In the step 1012, the microprocessor 41 reads out the x- and y-coordinate data and the screw head type data of the next circuit element to be tested and adjusted. Then the steps 1012 to 1032 are repeated until the testing and adjusting for the scheduled last circuit element becing completed.

When completion of testing and adjustment is detected at the step 1032, the process goes to a step 1034 for returning the carriage 27a and the screw driver unit frame 27b at respective initial positions. Therefore, the microprocessor 41 derives the shifting magnitude of the carriage 27a and the screw driver unit frame 27b based on the x- and y- coordinates of the last adjusting circuit element. Based on derived shifting magnitude, the microprocessor 41 derives the screw driver shift control signals for driving the pulse motors 29 and 32.

At a step 1036, the inital positions of the carriages 27a and the screw driver unit frame 27b are confirmed.

After the step 1036, the air cylinder 22 is deactivated to shift up the movable frame 21, at a step 1038. By shifting the movable frame 21 upwardly, the pusher rods 23 release from the printed circuit board 17. At the same time, since the pushing rods 38 release from the pallet support frame 9 to release the contact pins 7 from contacting to the printed circuit board.

In this condition, the pallet 15 can be removed from the pallet support frame.

In the aforementoined preferred embodiment of the automatic circuit adjusting system according to the invention, setting of the screw driver in engagement with the screw head of the adjusting screw of the circuit element to be adjusting is performed by applying a smaller driving torque for the driver head; however, it would be possible to set the driver head in an engaged position and detect the setting of the driver head in engagement with the screw head of the adjusting screw by detecting variation of the output by applying driving torque sufficient for rotating the adjusting screw and detecting variation of the output of the printed circuit board caused by angular displacement of the adjusting screw. This screw driver setting process is particularly adaptable when the circuit in the printed circuit board has a high responsing responding ability with respect to angular displacement of the circuit element to be adjusted. Also it would be possible to selectively use both of the aforementioned procedures for setting the screw driver in engagement with the screw head of the circuit element to be adjusted. In such cases, the routine of FIG. 12 may be used as a sub-routine of the program of FIG. 7. This sub-routine of FIG. 10 may be triggered at the step 1014. In addition, in order to enable selection of the aformentioned processes, the data stored in the table memory 38 includes data indicative of the responding ability of the circuit of the printed circuit board relative to the angular displacement of the associated adjusted screw.

Figure 12:
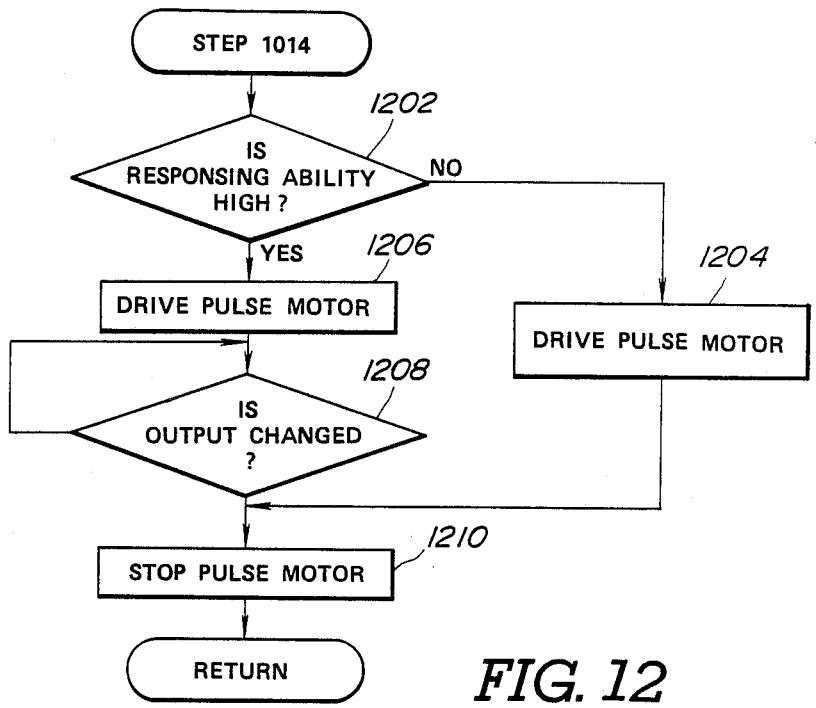
FIG. 12 is a flowchart of a sub-routine of a modification of the control program of FIG. 7, which sub-routine is to be executed at a step 1014 of the control program.

In execution of the sub-routine of FIG. 12, first, the table memory 38 is accessed to check whether the responding ability of the circuit is high enough to set the driver head in engagement with the screw head of the adjusting screw of the circuit element to be adjusted or not, based on the table data at a step 1202. When the responsing ability of the circuit with respect to the circuit element ot be adjusted is low, the microprocessor 41 produces the screw driver drive signal ordering high-speed, smaller torque, at a step 1204. On the other hand, when the responsing ability is high enough, the microprocessor 41 produces the screw driver drive signal with greater torque, at a step 1206. Then, the microprocessor 41 monitors output of the printed circuit board fed through the contact pin to detect variation of the output data, at a step 1208. When variation of the output data is detected, the microprocessor 41 stops the screw driver drive signal to stop revolution of the pulse motor 53 at a step 1210.

The procedure of setting the driver head in engagement with the screw head of the adjusting screw may be simplified by simply driving the driver devices at a smaller torque for a predetermined period of time. Though this may take relatively longer period of time for preforming testing and adjustment and cannot check the angular position of the adjusting screw, this procedure may be preferred when lower cost is desired.

As will be appreciated, the automatic circuit adjusting system according to the present invention is applicable for various printed circuit boards without requiring substantial re-arrangement of the system. Namely, in order to adapt the system for different printed circuit boards, only replacement of the table memory data, reference memory data and driver heads corresponding to the printed cirucit boards is required. Furthermore, since the screw driver unit has a relatively simple construction, it may be composed in compact enough to allow the overall system to be compact.

It should be appreciated that the preferred embodiment of the automatic circuit adjusting system employs the screw driver assembly for performing adjusting operation of printed circuit boards, the system may also be applicable in various processes by utilizing various tools. For instance, if marking heads are attached to the carriage in the manner similar to that of the screw driver unit, marking operations on the printed circuit board can be automatically effected.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. An automatic circuit adjusting system comprising:
   an adjusting tool assembly with adjusting tools for performing adjustment on a circuit element on a printed circuit board;
   a driving means associated with said adjusting tool assembly for driving said adjusting tool;
   a movable frame carrying said adjusting tool assembly for shifting the latter within a predetermined two-dimensional coordinate system;
   first means for supporting said printed circuit board in a predetermined orientation with respect to said two-dimensional coordinate system;
   second means for applying a preset test signal to the circuit element of the printed circuit board, said second means for receiving an output in response to said test signal from said printed circuit board, and comparing said output of said printed circuit board with a predetermined refernce signal for deriving an error signal;
   third means for shifting said movable frame according to a predetermined schedule for positioning said adjusting tool assembly in alignment with each of said circuit elements to be adjusted in order; and
   fourth means for deriving an adjusting magnitude for the circuit element to be adjusted based on said error signal and producing a driver signal for driving said driving means at a magnitude corresponding to the value of said error signal.

2. An automatic circuit adjusting system as set forth in claim 1, wherein said adjusting tool assembly has a plurality of mutually different adjusting tools for performing adjustments on different circuit elements.

3. An automatic circuit adjusting system as set forth in claim 2, wherein said driving means comprises a single driving motor designed for driving said plurality of adjusting tools.

4. An automatic circuit adjusting system as set forth in claim 3, wherein said driving motor is drivingly associated with each of said adjusting tool through a power train.

5. An automatic circuit adjusting system as set forth in claim 4, wherin said power train is so designed as to constantly distribute driving torque of said driving motor to its respective adjusting tools.

6. An automatic circuit adjusting system as set forth in claim 5, which further comprises fifth means selecting one of said adjusting tools according to a type of the circuit element to be adjusted and coupling a selected one of said adjusting tools to said circuit element.

7. An automatic circuit adjusting system as set forth in claim 1, wherein said adjusting tool comprises a screw driver for rotatingly adjusting the circuit element to be adjusted, in which the circuit element includes a screw head to be rotated for adjustment, and said fourth means adjusts driving torque of said driving means for driving said screw driver with a first torque wihich is smaller than that required for rotatingly driving said screw head of said circuit element for establishing engagement between a driver head of said screw driver and said screw head.

8. An automatic circuit adjusting system as set forth in claim 7, wherein said fourth means drives said screw driver with said first tongue for a given period of time which is determined in view of the possible maximum period required for establishing engagement between said driver head and said screw head.

9. An automatic circuit adjusting system as set forth in claim 8, which further comprises a sixth means for storing angular position data of said screw head for driving said screw driver at the corresponding angular position for re-establishing engagement between said driver head and said screw head after once performing adjustment of said circuit element.

10. An automatic circuit adjusting system as set forth in claim 1, wherein said adjusting tool comprises a screw driver for rotatingly adjusting the circuit element to be adjusted, in which circuit element includes a screw head to be rotated for adjustment, and said fourth means drives said driving means under the control of said second means which continuously applies a test signal and monitors output of said printed circuit board in order to stop driving of said driving motor when output of said printed circuit board changes.

11. An automatic circuit adjusting system as set forth in claim 1, wherein said third means includes a table memory storing position data of said circuit element to be adjusted, with respect to said two-dimensional coordinate system for identifying orientation of said circuit element to be adjusted.

12. An automatic circuit adjusting system as set forth in claim 11, wherein said third means comprises a first frame movable in a first direction parallel to one axis of said two-dimensional coordinate system, and a second frame movable in a second direction parallel to second axis of said two-dimensional coordinate system and perpendicular to said first direction.

13. An automatic circuit adjusting system as set forth in claim 12, wherein said adjusting tool assembly is mounted on said second frame for movement therewith in said second direction, and said second frame is mounted on said first frame for movement therewith in said first direction.

14. An automatic circuit adjusting system as set forth in claim 1, wherein said adjusting tool assembly has a plurality of mutually different adjusting tools for performing adjustment on different circuit elements, and said system further comprises firfth means selecting one of said adjusting tools according to type of the circuit element to be adjusted and coupling a selected one of said adjusting tools to said circuit element.

15. An automatic circuit adjusting system as set forth in claim 14, wherein said third means includes a table memory storing position data of said circuit element to be adjusted and data identifying one of said adjusting tools to be used for performing adjustment of said circuit element to be adjusted, said position data being preset with respect to said two-dimensional coordinate system for identifying orientation of said circuit element to be adjusted.

16. An automatic circuit adjusting system as set forth in claim 15, wherein said third means derives shifting magnitude of said adjusting tool assembly for aligning said selected one of said adjusting tools to the circuit element to be adjusted.

17. An automatic circuit adjusting system for testing and adjusting a plurality of circuit elements on a printed circuit board, comprising:
  a single tool assembly movable on a two-dimensioned coordinate system and having a plurality of tools, each of which is designed for performing adjustment of corresponding one or more circuit elements;
  a driving means for selectively operating one of said tools in said tool assembly for performing adjustment of one of said circuit element elements coupled with said one of tools;
  first means for supporting said printed circuit board in a predetermined orientation in said two-dimensional coordinate system;
  second means for producing a test signal for performing testing of said printing circuit board, said test signal being so determined as to obtain a predetermined output from said printed circuit board when the circuit element is acurately adjusted;
  third means for receiving said output of said printed circuit board produced in response to said test signal and comparing said output with a predetermined reference signal representative of said predetermined output to be received when said circuit element is acurately adjusted, said third means producing an error signal based on a deviation between said output of said printed circuit board and said reference signal; and
  fourth means for driving said tool assembly to shift said selected one of tools in alignment with said circuit element to be adjusted and driving said one of tools for adjustment so as to reduce said error signal value to zero.

18. An automatic circuit adjusting system as set fourth in claim 17, wherein said fourth means includes a table memory storing position data of a plurality of circuit elements and orders for performing adjustments.

19. An automatic circuit adjusting system as set forth in claim 18, wherein said table memory further stores data identifying one of said tools to be utilized for adjustment with respect to each of said circuit elements to be adjusted.

20. An automatic circuit adjusting system as set forth in claim 19, including means which allows for re-adjustment of the circuit element which is once adjusted.

21. An automatic circuit adjusting system as set forth in claim 20, wherein said first means includes a conductive means releasably connecting said second means and third means to said printed circuit board.

22. An automatic circuit adjusting system as set forth in claim 21, wherein said conductive means comprises a plurality of contact pins, each of which is oriented to contac with terminals formed on the printed circuit board for establishing signal transmission between said second and third means and said printed circuit board.

23. An automatic circuit adjusting system as set forth in claim 22, wherein said tools comprise screw drivers having mutually different driver heads.

24. An automatic circuit adjusting system as set forth in claim 23, wherein said screw drivers are drivingly associated with a common driving motor incorporated in said fourth means to be driven by said common driving motor.

25. An automatic circuit adjusting system as set forth in claim 24, wherein said fourth means includes means for coupling a selected one of said screw driver drivers to a screw head of said circuit element to be adjusted.

26. An automatic circuit adjusting system as set forth in claim 25, wherein said common driving motor drives said plurality of screw drivers constantly at the same rotation speed in relation to each other.

27. An automatic circuit adjusting system as set forth in claim 1, wherein said driving means includes a common driving motor for driving said adjusting tools.

28. An automatic circuit adjusting system as set forth in claim 1, wherein a circuit element on said printed circuit board can be adjusted by a corresponding adjusting tool of the adjusting tool assembly independently of other circuit elements.

29. An automatic circuit adjusting system as set forth in claim 2, wherein a circuit element on said printed circuit board can be adjusted by one of the adjusting tools of the adjusting tool assembly independently of other circuit elements.

* * * * *